(12) United States Patent
Zilberman

(10) Patent No.: US 6,829,721 B2
(45) Date of Patent: Dec. 7, 2004

(54) METHOD FOR RECORDING AND STORAGE OF SYSTEM INFORMATION IN MULTI-BOARD SOLID-STATE STORAGE SYSTEMS

(75) Inventor: Eugene Zilberman, Richmond Hill (CA)

(73) Assignee: M-Systems Flash Disk Pioneers Ltd., Kfarsaba (IL)

(*) Notice: Subject to any disclaimer, the term of this patent is extended or adjusted under 35 U.S.C. 154(b) by 593 days.

(21) Appl. No.: 09/775,496

(22) Filed: Feb. 5, 2001

(65) Prior Publication Data

US 2002/0108075 A1 Aug. 8, 2002

(51) Int. Cl.⁷ .............................................. G06F 11/00
(52) U.S. Cl. ................................ 714/8; 714/6; 711/170
(58) Field of Search ..................... 714/6, 7, 8; 711/147, 711/170

(56) References Cited

U.S. PATENT DOCUMENTS

| | | | | |
|---|---|---|---|---|
| 5,200,959 A | * | 4/1993 | Gross et al. ............... | 714/723 |
| 5,297,148 A | * | 3/1994 | Harari et al. .............. | 714/710 |
| 5,430,859 A | * | 7/1995 | Norman et al. ............ | 711/103 |
| 5,663,901 A | * | 9/1997 | Wallace et al. ............. | 365/52 |
| 5,867,417 A | * | 2/1999 | Wallace et al. ............. | 365/52 |
| 6,018,626 A | * | 1/2000 | Zook ......................... | 703/24 |
| 6,052,798 A | * | 4/2000 | Jeddeloh .................... | 714/8 |
| 6,298,426 B1 | * | 10/2001 | Ajanovic .................... | 711/172 |
| 6,601,140 B1 | * | 7/2003 | Okaue et al. .............. | 711/115 |

* cited by examiner

Primary Examiner—Robert Beausoliel
Assistant Examiner—Joshua Lohn
(74) Attorney, Agent, or Firm—Mark M. Friedman

(57) ABSTRACT

A system and method for simplifying the testing and manufacturing process of multi-board solid-state storage systems. The system is constructed by placing secondary non-volatile memory components onto every board in multi-board system that carries primary solid-state components. This allows separate or independent testing of the boards, and final construction of the solid-state system by simply connecting these boards, without the need to either test the completely constructed system or to transfer geometry, faulty location and auxiliary records if the boards have been tested independently.

The best mode of the invention is a solid-state storage system, wherein system data is stored on multiple boards, so that each board is a separate entity and can be attached, removed or replaced without additional steps for transferring the system information.

6 Claims, 2 Drawing Sheets

Drawings

METHOD FOR RECORDING AND STORAGE OF SYSTEM INFORMATION IN MULTI-BOARD SOLID-STATE STORAGE SYSTEMS

FIELD AND BACKGROUND OF THE INVENTION

The present invention relates to a system and method for data recording in multi-board solid-state storage systems. Specifically it enables these systems to efficiently record geometry, faulty locations, security and auxiliary data, so as to improve system efficiency during testing, manufacturing and maintenance of such systems.

The expansion in usage of solid-state storage systems has created an ever-growing need for non-volatile stable and secure data recording systems on computing devices. These solid-state storage systems require solid-state memory devices, and are increasingly requiring more efficient, stable and cheaper non-volatile memory components in order to store relevant data. By the term solid-state storage system, we understand an electronic data storage system, where said data is stored on solid-state electronic components, such as Flash, EEPROM, RAM and such. That data is received from or transferred to a host computer system(s).

There are currently several existing technologies dealing with methods for recording faulty locations and other system information:

Typical solid-state storage systems consist of a main system board that carries a processing system (based on CPU and/or controller) that allows interaction with the host system, and an array of primary memory solid-state components used for information storage (such as RAM, EEPROM, Flash). That array of primary memory solid-state components can be located both on the main system's board and/or on additional boards. These primary solid-state components sometimes have intrinsic defects that lead to failures at some memory locations of the chip, but do not prohibit its use in other locations. The faulty locations of these solid-state components can be recorded in order to avoid accessing them in the future.

One method of recording such errors or faulty locations is on the primary solid-components array itself. Another method for recording of various types of errors or faults in the primary array of solid-state components, is to add a separate secondary non-volatile memory component, with lower error rate, to record these errors or faults. Since the capacity that is required for faulty location recording is very small in comparison to the capacity of the primary solid-state array, it can all be placed in one secondary non-volatile memory component, located on the main system's board. According to this method, when a system with several boards of primary solid-state components is tested, the errors or faulty locations of all the boards are recorded. However, since the error or faulty location records of different boards are placed into one component, a board cannot be simply replaced or added, because this process requires replacement or addition of the error or faulty location record information. This requires additional functionality and additional steps in the manufacturing and maintenance processes, making such a multi-board solid-state storage system more expensive.

The principles and operations of such a system may be better understood with reference to the following figures and accompanying descriptions, wherein:

FIG. 1 illustrates a typical multi-board solid-state storage system, with 3 memory boards which carry parts of solid-state component's array and one main board (which optionally carries part of solid-state component's array).

Since the capacity that is required for error and other recordings is very small in comparison to the capacity of the primary solid-state array, it can all be placed in one secondary non-volatile memory component, located on the main system's board.

FIG. 2 illustrates an example of information layout in the secondary non-volatile memory in the typical multi-board solid-state storage system. Since the error or faulty location records of different boards are placed in one component, a board cannot be simply replaced or added, because this process requires replacement or addition of the error or faulty location record information. This requires additional functionality and additional steps in the manufacturing and maintenance procedures.

There is thus a widely recognized need for, and it would be highly advantageous to have, a system and method for efficiently recording system information in multi-board solid-state storage systems, such that manufacturing and maintenance of memory boards can be executed without a need for manually processing (adding or replacing) that system information.

The present invention answers such a need by placing a secondary non-volatile memory onto every board in a multi-board system. This additional memory carries the record of faulty locations in the primary solid-state components on that board and other system information related to that board, such as primary solid-state array geometry information, manufacturing information, and security information. This allows separate or independent testing of the boards, and final construction of the solid-state system by simply connecting these boards, without the need to either test the completely constructed system or to transfer the error and other records if the boards have been tested independently. Additions or replacements in current solid-state systems require users to extract the relevant information from the one secondary non-volatile memory component, and transfer to such a component on another unit. This requires additional manufacturing or support steps, additional utilities and time. In contrast to this, having a separate secondary component, such as that prescribed by the present invention, allows a 'plug and play' approach. Accordingly, all that is required is to connect or replace a memory board, and it is not necessary to perform any additional steps to transfer the information. This is what is referred to as performing direct actions of manufacturing, testing, adding, connecting and/or replacing boards in response to board malfunctioning or a need to increase capacity etc. These actions can be performed in any way, be it semi-automatic, automatic or manual, These actions can be performed without the need for a separate process by which there is a transfer of the system information, relevant to the new or replaced boards, to the storage system.

The present invention is innovative in that it provides a way to efficiently manufacture and maintain a scalable data recording system. The present invention enables such secure and scalable abilities due to its ability to store critical information on various memory boards, such that each board interacts with other boards, yet can be easily updated and replaced without effecting the entire system.

The invention is non-obvious in that it is based on a notion of adding additional hardware components to a system. This seems to be a negative factor, since it requires additional expenses to manufacture and utilizes valuable board space. However this system saves much time and money in upgrading and maintenance, and is thus a more efficient system.

SUMMARY OF THE INVENTION

According to the present invention there is provided a system and method for data recording in multi-board solid-state storage systems. This data may include geometry, error or faulty location records, manufacturing, security and auxiliary data (whatever other data that is relevant to a specific board). It allows the simplification of the testing and manufacturing process of the mentioned systems.

The present invention places a secondary non-volatile memory system onto every board in multi-board system that carries primary solid-state components. This allows separate or independent testing of the boards, and final construction of the solid-state system by simply connecting these boards, without the need to either test the completely constructed system or to transfer the error or faulty location, and other records if the boards have been tested independently.

The components of the present invention are:
i) A solid state storage system
ii) Multiple boards carrying primary solid-state components (such as Flash, RAM, EEPROM);
iii) At least one non-volatile memory device (chip or component of larger integrated circuit) for every board in a multi-board system that carries primary solid-state components, storing any one of the following or a combination thereof:
   a) One or more records of failed blocks or locations;
   b) a description of the geometry of the primary solid-state component array;
   c) Manufacturing information for that board
   d) Security information for that board such as password(s) or key(s)

The present invention also provides a method for recording system information in a multi-board solid state storage system, comprising the steps of:
   (a) Placing a respective secondary non-volatile memory device onto each board of the multi-board solid state storage system;
   (b) For each board, recording system information of each board on a secondary non-volatile memory device thereof; and
   (c) Storing the system information in the secondary non-volatile memory device.

The best mode of the invention is a solid-state storage system, wherein system data is stored on multiple boards so that each board presents a separate entity and can be attached, removed or replaced without additional steps for transferring the system information.

DESCRIPTION OF THE PREFERRED EMBODIMENT

Figure 1:
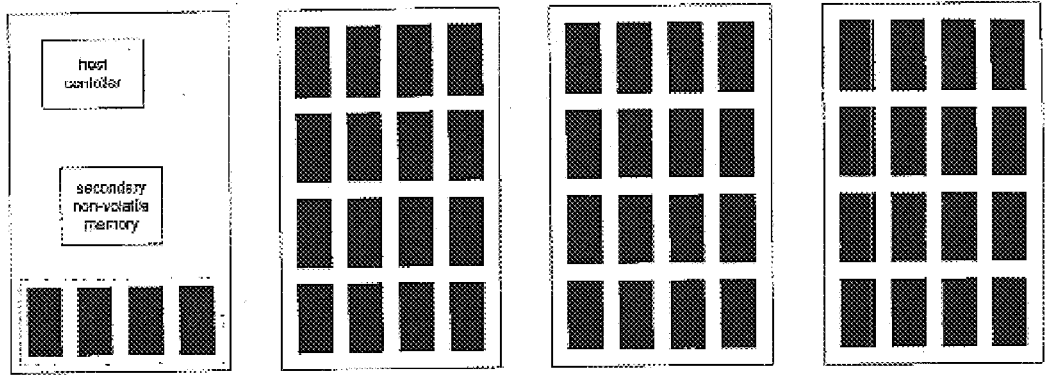
FIG. 1: Illustrates a typical multi-board solid-state storage system, with 3 memory boards which carry parts of the solid-state component's array and one main board (which optionally carries part of solid-state component's array).
Figure 2:
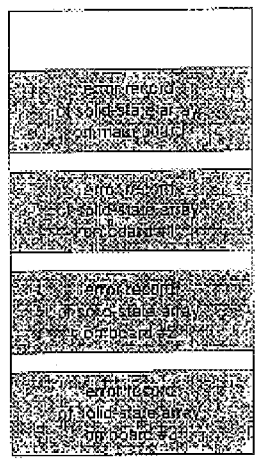
FIG. 2: Illustrates an example of information layout in the secondary non-volatile memory in the typical multi-board solid-state storage system.

The present invention is of a system and method for data recording in multi-board solid-state storage systems.

Specifically, the present invention is of a system for recording and storing geometry, error or faulty location, security and any other data that is relevant to a specific memory board. This system incorporates additional non-volatile memory devices (such as chips or components of larger integrated circuits) in multi-board solid-state storage systems, in order to simplify the testing and manufacturing process of the mentioned systems. Geometry, error or faulty location, security and manufacturing data relevant to each board is stored in the secondary non-volatile memory device on that board. This allows separate or independent testing of the boards, and final construction of the solid-state system by simple connecting these boards, without the need to either test the completely constructed system or to transfer the faulty location and other records if the boards have been tested independently; when a board within a unit should be replaced, this can be done without additional operations to transfer the faulty location and other records related to the new board. Every board carries system information relevant only to that board, as opposed to current methods, wherein all that information is concentrated on one (main) board.

Specifically, when unit is activated, it may use the geometry information on every board either to verify the hardware access to components on that board, and/or to initialize the software that controls the primary solid-state component's array. When a defect in the primary solid-state components is detected (either during the manufacturing, testing or normal operation of the unit) the block or location of that error car be recorded on the secondary non-volatile memory of the board, on which the defect is located. That block or location can be avoided in further operation of the unit. The manufacturing information (such as serial number of the board) can be used to simplify the logistics of manufacturing, testing and maintenance). The security information (such as passwords or keys) can be used to limit access to the information on the primary solid-state components and/or to store it in encrypted form.

The present invention allows testing such boards of primary solid-state components independently (separately or in batches). Then different boards can be added onto the different main system's board, and can be tested independently without the necessity to explicitly transfer the error or faulty location records and geometry information. Also, a faulty board can be simply replaced without the necessity to explicitly transfer its faulty location records and geometry information.

In addition to recording faulty locations, solid-state storage systems can also optionally record geometry of memory boards (such as number of chips, their type, etc), manufacturing (such as serial number) and security information.

Figure 3:
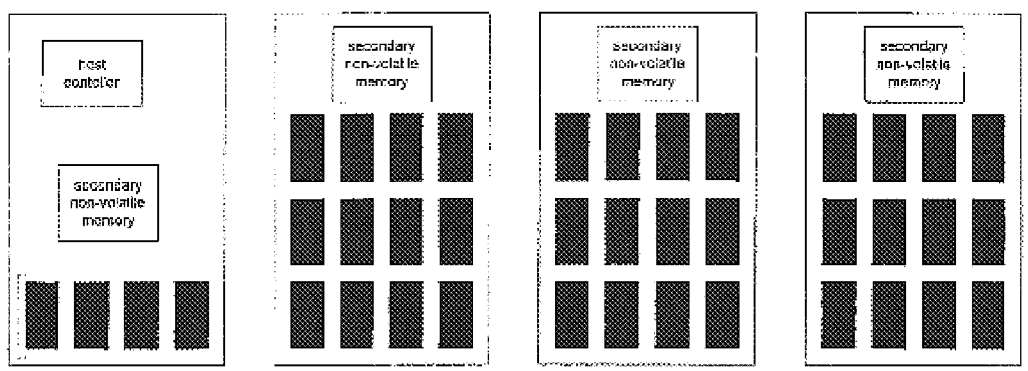
FIG. 3: Illustrates a multi-board solid-state storage system suggested in the present invention, with 3 memory boards which carry parts of solid-state component's array and one main board (which optionally carries part of solid-state component's array).

The principles and operations of such a system according to the present invention may be better understood with reference to the following figures and accompanying descriptions, wherein:

FIG. 3 illustrates a multi-board solid-state storage system suggested in the present invention, with 3 memory boards which carry parts of solid-state component's array and one main board (which optionally carries part of solid-state component's array).

The present invention places such secondary non-volatile memory onto every board in multi-board system that carries primary solid-state components. This has higher direct cost than recording all errors or faulty locations on one secondary non-volatile memory component, but allows treating each memory board as a separate entity. The present invention allows the independent testing of boards of primary solid-state components (separately or in batches). Then different boards can be added onto the different main system's board, which can be tested independently without the necessity to explicitly transfer the faulty location records and geometry information. Also, a faulty board can be simply replaced without the necessity to explicitly transfer its error or faulty location records and geometry information.

Figure 4:
FIG. 4: Illustrates an example of information layout on the board of the secondary non-volatile memory, in the multi-board solid-state storage system suggested by the present invention.

FIG. 4 illustrates an example of information layout in the secondary non-volatile memory board in the multi-board solid-state storage system suggested in the present invention. In addition to the various records of failed blocks or locations the secondary non-volatile component (either chip or a part of larger integrated circuit) can contain the description of the geometry of the primary solid-state component array (geometry i.e. number of chips, their interleaving, number of banks, chip capacity and type, block size, number of blocks) and the manufacturing information for that board, such as Serial Number of the whole board or some of its components.

Such non-volatile memory (on every board which carries primary solid-state components) would optionally contain:

i. The record of failed blocks or locations (possibly in the form of a bitmap or in the form of a list). One or more of the error or faulty location records can exist, as described below.

ii. A description of the geometry of the primary solid-state component array (i.e. number of chips, their interleaving, number of banks, chip capacity and type, block size, number of blocks).

iii. Manufacturing information for that board, such as Serial Number of the whole board or some of its components.

iv. Security information for that board such as password(s) or key(s).

The storage system will be able to avoid access to failed locations, record new failures, verify the operation of the primary solid-state array by comparing the recorded geometry with the actual electronic access, and report the manufacturing information of its boards, such as Serial Number(s).

The best mode of the invention is a solid-state storage system, wherein system data is stored on multiple boards so that each board is a separate entity and can be attached, removed or replaced without additional steps for transferring the system information.

The present invention might also be implemented in a non-volatile memory that carries two or more error/faulty location-recording areas. One record can be made during the manufacturing process and remain unchanged afterwards. The other record will be initially identical to the record made during the manufacturing process, but will be updated by failures during the system's operation, and will be used routinely to avoid access to failed locations. Such arrangement allows restoration of the original faulty location record in the case the current faulty location record is lost, and also allows comparison in order to determine the locations and number of the accumulated failures.

More error or faulty location recording areas can be used to differentiate between different kinds of solid-state component failures, or to provide redundancy.

While the invention has been described with respect to a limited number of embodiments, it will be appreciated by someone ordinarily skilled in the art that many variations, modifications and other applications of the invention may be made.

What is claimed is:

1. A system for recording data in a multi-board solid-state storage system, comprising:

i. at least one main board that includes a processing system for enabling interaction with a host system;

ii a plurality of memory boards separate from said main board, such that each said memory board carries at least part of the storage system's primary solid-state components array used for data storage; and iii for each said memory board, at least one secondary non-volatile memory device, located on said each memory board, and containing at least one faulty location record for said primary solid-state components array located on said each memory board;

wherein said primary solid-state components are non-volatile memory devices; and wherein said main board includes:

a) at least a portion of said primary solid-state components array, and b) at least one respective secondary non-volatile memory device containing system information related to said main board.

2. The system of claim 1, wherein said primary solid-state components are Flash memory devices.

3. The system of claim 1, comprising at least three said memory boards.

4. A method for recording system information in a multi-board solid state storage system that includes a main board and a plurality of memory boards separate from the main board, the main board including a processing system for enabling interaction with a host system, the method comprising the steps of:

i Providing primary non-volatile solid-state memory devices on each memory board of the multi-board solid state storage system;

ii Placing a respective secondary non-volatile memory device onto each memory board of the multi-board solid state storage system;

iii For each memory board, recording faulty location records of said each board on said secondary non-volatile memory device thereof;

iv providing a primary non-volatile solid-state memory device on the main board of the multi-board solid state storage system;

v placing a respective secondary non-volatile memory device onto the main board of the multi-board solid state storage system; and vi recording faulty location records of the main board on said secondary non-volatile memory device thereof.

5. The method of claim 4, further comprising:

vii performing direct actions selected from the group consisting of testing, adding, connecting and replacing said boards.

6. The method of claim 4, wherein said primary non-volatile solid-state memory devices are Flash memory devices.

* * * * *